(12) United States Patent
Venkiteswaran et al.

(10) Patent No.: US 11,929,717 B2
(45) Date of Patent: Mar. 12, 2024

(54) DYNAMIC CURRENT LIMIT FOR OPERATIONAL AMPLIFIER

(71) Applicant: TEXAS INSTRUMENTS INCORPORATED, Dallas, TX (US)

(72) Inventors: Mahadevan Shankara Venkiteswaran, Bangalore (IN); Arun Singh, Bangalore (IN); Jofin Vadakkeparasseril Joseph, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/582,338

(22) Filed: Jan. 24, 2022

(65) Prior Publication Data

US 2023/0238920 A1    Jul. 27, 2023

(51) Int. Cl.
    *H03F 1/52*   (2006.01)
    *H03F 1/30*   (2006.01)
    *H03F 3/00*   (2006.01)
    *H03F 3/45*   (2006.01)
(52) U.S. Cl.
    CPC .............. *H03F 1/303* (2013.01); *H03F 1/52* (2013.01); *H03F 3/005* (2013.01); *H03F 3/45632* (2013.01)

(58) Field of Classification Search
    CPC . H03F 1/303; H03F 1/52; H03F 3/005; H03F 3/45632
    USPC ........................................ 330/298, 207 P, 277
    See application file for complete search history.

(56) References Cited

U.S. PATENT DOCUMENTS

| 7,719,363 | B2* | 5/2010 | Wong ...................... H03F 1/523 |
| | | | 330/51 |
| 8,373,957 | B2* | 2/2013 | Niiyama ............ H03K 17/0826 |
| | | | 361/91.1 |
| 11,018,663 | B2 | 5/2021 | Son et al. |

OTHER PUBLICATIONS

Texas Instruments Incorporated, "TPS249x Positive High-Voltage Power-Limiting Hot Swap Controller" Published Feb. 2020.

* cited by examiner

*Primary Examiner* — Hieu P Nguyen
(74) *Attorney, Agent, or Firm* — John R. Pessetto; Frank D. Cimino

(57) ABSTRACT

An output stage of an operational amplifier includes a low voltage (LV) metal oxide semiconductor (MOS) device and a dynamic current limit circuit. An output current of the operational amplifier flows through the LV MOS device. The dynamic current limit circuit is configured to sense a drain voltage of the LV MOS device and increase a clamping voltage for the LV MOS device when the drain voltage of the LV MOS device is less than a threshold voltage.

14 Claims, 5 Drawing Sheets

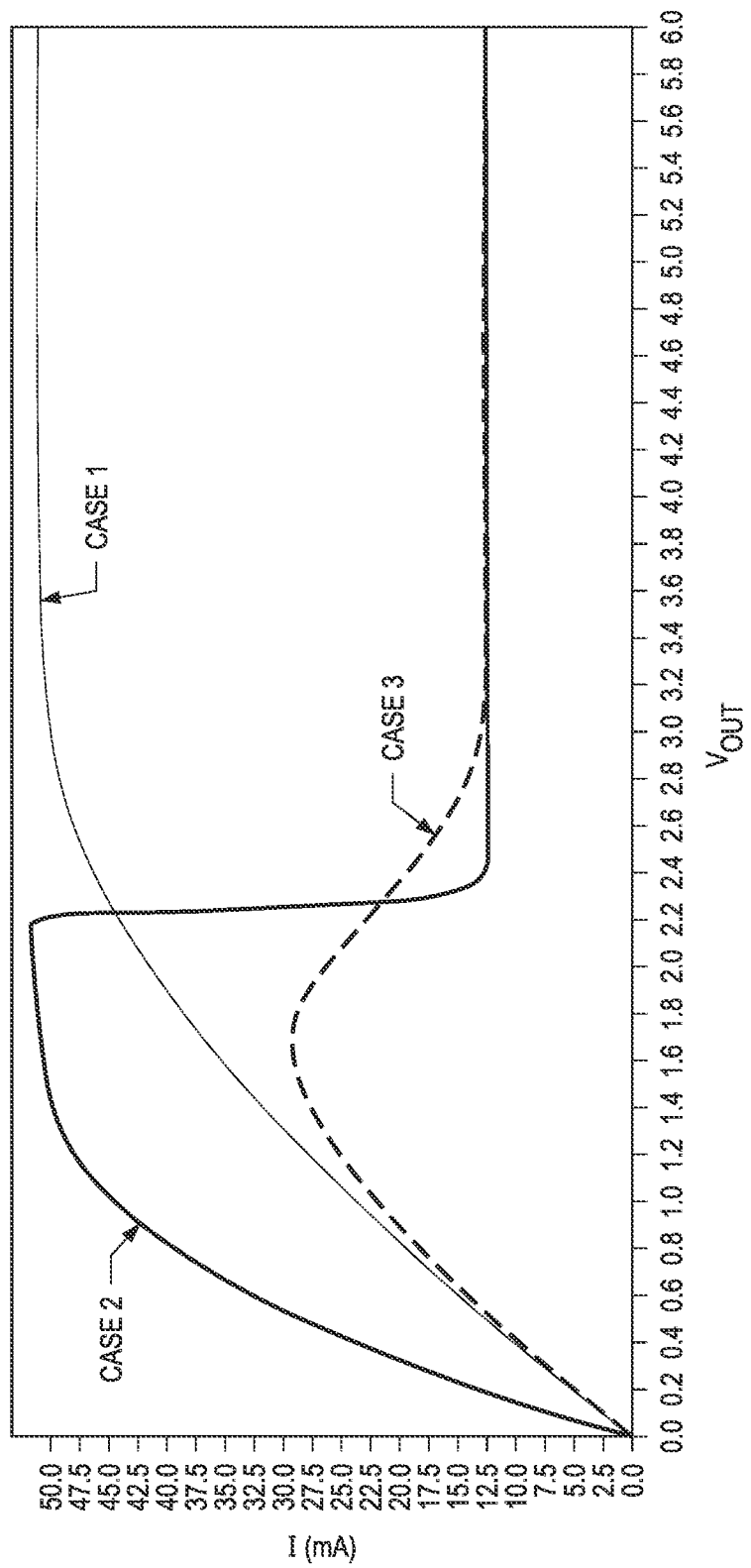

DYNAMIC CURRENT LIMIT FOR OPERATIONAL AMPLIFIER

BACKGROUND

The proliferation of electronic devices and integrated circuit (IC) technology has resulted in the commercialization of IC products. As new electronic devices are developed and IC technology advances, new IC products are commercialized. Many IC products use power metal-oxide semiconductor field-effect transistors (MOSFETs), where the safe operation area (SOA) of the power MOSFETs becomes more limited as the MOSFET structures become increasingly smaller.

SUMMARY

In one example, an output stage of an operational amplifier includes a first metal oxide semiconductor (MOS) device and a dynamic current limit circuit. The first MOS device has a first gate, a first drain, and a first source. An output current of the operational amplifier flows through the first MOS device. The dynamic current limit circuit includes a second MOS device having a second gate, a second drain, and a second source, the second gate being coupled to a drain of the first MOS device and a resistor coupled between the second drain and a common node. The dynamic current limit circuit also includes a third MOS device having a third gate, a third drain, and a third source, the third gate being coupled to a threshold voltage, the third source being coupled to the second source, and the third drain being coupled to a first current source. The second MOS device operates in an OFF mode when a drain voltage of the first MOS device is greater than the threshold voltage and the second MOS device operates in an ON mode when the drain voltage of the first MOS device is less than the threshold voltage. The dynamic current limit circuitry includes a plurality of series-connected MOS devices. A first voltage is generated across the plurality of series-connected MOS devices in response to a biasing current supplied to a drain of one of the plurality of series-connected MOS devices. A source of another of the plurality of series-connected MOS devices is coupled to the resistor so that a combination of a first current flowing through the second MOS device and a second current flowing through the plurality of series-connected MOS devices generates a second voltage across the resistor. A drain voltage of the one of the plurality of series-connected MOS devices is a sum of the first voltage and the second voltage. The dynamic current limit circuit includes a voltage clamp circuit coupled between the drain of the one of the plurality of series-connected MOS devices and the first gate, wherein a gate to source voltage of the first MOS device is limited to the drain voltage of the one of the plurality of series-connected MOS devices.

In one example, an output stage of an operational amplifier includes a low voltage (LV) metal oxide semiconductor (MOS) device and a dynamic current limit circuit. An output current of the operational amplifier flows through the LV MOS device. The dynamic current limit circuit is configured to sense a drain voltage of the LV MOS device and increase a clamping voltage for the LV MOS device when the drain voltage of the LV MOS device is less than a threshold voltage.

In one example a dynamic current limit circuit includes a first MOS device, a resistor, a second MOS device, a plurality of series-connected MOS devices, and a voltage clamp circuit. The first MOS device has a first gate, a first drain, and a first source, the first gate being coupled to a drain of a low voltage MOS device in an output stage of an operational amplifier. The resistor is coupled between the first drain and a common node. The second MOS device has a second gate, a second drain, and a second source, the second gate being coupled to a threshold voltage, the second source being coupled to the first source, and the second drain being coupled to a first current source. The first MOS device operates in an OFF mode when a drain voltage of the low voltage MOS device is greater than the threshold voltage, and the first MOS device operates in an ON mode when the drain voltage of the low voltage MOS device is less than the threshold voltage. A first voltage is generated across the plurality of series-connected MOS devices in response to a biasing current supplied to a drain of one of the plurality of series-connected MOS devices. A source of another of the plurality of series-connected MOS devices is coupled to the resistor so that a combination of a first current flowing through the first MOS device and a first current flowing through the plurality of series-connected MOS devices generates a second voltage across the resistor and a drain voltage of the one of the plurality of series-connected MOS devices is a sum of the first voltage and the second voltage. The voltage clamp circuit is coupled between the drain of the one of the plurality of series-connected MOS devices and a gate of the low voltage MOS device in the output stage of the operational amplifier. A gate to source voltage of the low voltage MOS device in the output stage of the operational amplifier is limited to the drain voltage of the one of the plurality of series-connected MOS devices.

BRIEF DESCRIPTION OF THE DRAWINGS

FIG. 6 is a current vs. voltage plot that illustrates the behavior of the dynamic current limit circuit of FIG. 3 with three different sets of design parameters, according to one aspect of this description.

The same reference number or other reference designators are used in the drawings to designate the same or similar (functionally and/or structurally) features.

DETAILED DESCRIPTION

The drawings may not be drawn to scale.

Operational amplifiers have a specified "short circuit current" which is the maximum current that the operational amplifier will source or sink at the operational amplifier's maximum output voltage. To protect against exceeding SOA/heat dissipation limits, some operational amplifiers employ some type of current limiting in their output stage. One type of current limiting is fixed current limiting in which the current that is sourced or sunk by the output stage of the operational amplifier is limited to the short circuit current.

Figure 1:
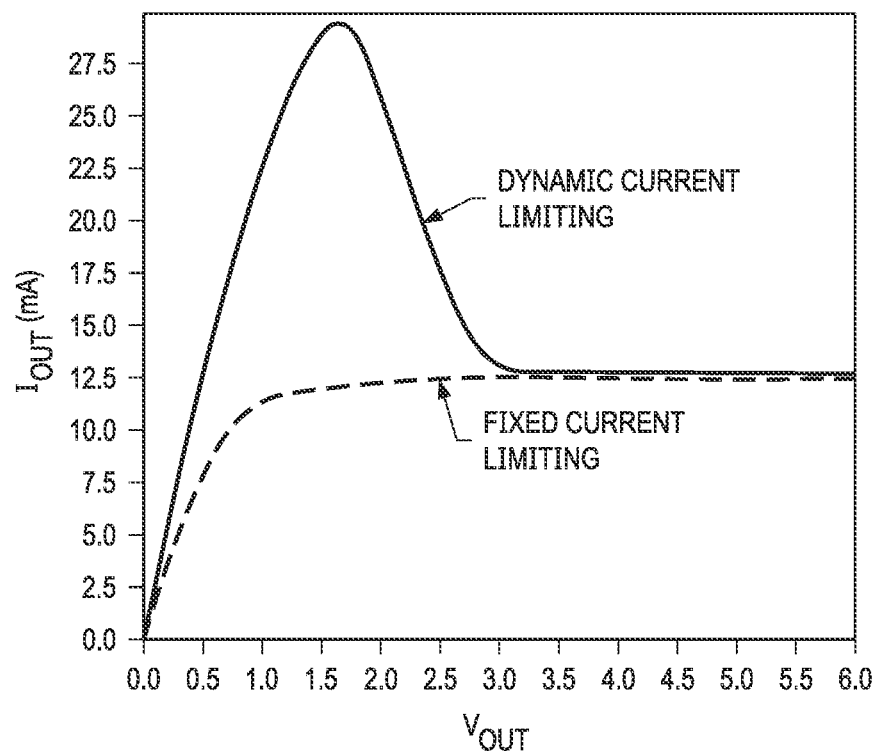
FIG. 1 is a current vs. voltage plot that illustrates the behavior of a dynamic current limit circuit, according to one aspect of this description.

FIG. 1 is a current vs. voltage plot depicting the maximum current that can be sourced or sunk by an output stage of an operational amplifier as a function of output voltage. For the purposes of the example shown in FIG. 1, the maximum output voltage of the operational amplifier is 6 V. Thus, for the operational amplifier whose characteristics are illustrated in FIG. 1, the short circuit current is the maximum allowable current (in terms of SOA/heat dissipation limits) when the output stage is at 6V, or approximately 12.5 mA. The fixed current limiting technique is shown in dashed line in FIG. 1. It can be seen that at output voltages higher than approximately 0.75V the current sourced or sunk by the operational amplifier output stage is limited to the short circuit current of approximately 12.5 mA even though at 0.75V a much higher current could be sourced or sunk by the output stage while remaining within the SOA/heat dissipation limits. As the expected operating voltages of operational amplifiers increase, this limiting of current sinking or sourcing capabilities to the short circuit current unnecessarily caps the current sourced or sunk by the operational amplifier through a significant portion of its operating range.

Described herein are operational amplifier output stage topologies that feature a dynamic current limit circuit to allow an output stage metal-oxide semiconductor (MOS) device (e.g., MOSFET such as a p-type MOSFET (PMOS) based circuit) to sink (or source) current higher than the short circuit current of the operational amplifier when the output voltage of the operational amplifier is relatively low. The described topologies sense when the output of the operational amplifier is at or near a threshold voltage that is selected based on SOA/heat dissipation limits of devices in the output stage. When the output of the operational amplifier is below the threshold voltage, the dynamic current limit circuit controls the gate voltage of an output stage MOS device to increase the amount of current that can flow through the output stage of the operational amplifier. When the output of the operational amplifier is greater than the threshold voltage, the dynamic current limit circuit controls the gate voltage of the output stage MOS device to limit the amount of current that can flow through the output stage to the short circuit current. In this manner, the current that can be sunk or sourced is increased at lower output voltages but will not exceed SOA/heat dissipation limits for MOS devices (e.g., a high voltage (HV) MOS device) in the operational amplifier at higher output voltages. The sensing and control are performed without using a complex feedback loop or control algorithm and, in some examples, use only low voltage devices.

Throughout this description, components that are exemplary versions of a same or analogous component are assigned reference characters having the same value for the last two digits while the initial digit(s) of reference characters are assigned based on the FIG. number in which they are first introduced.

Throughout this description, certain devices are described and/or illustrated as being either n-type or p-type MOS devices. It is to be understood that in other examples the devices may have an opposite type channel with appropriate design modification.

Figure 2:
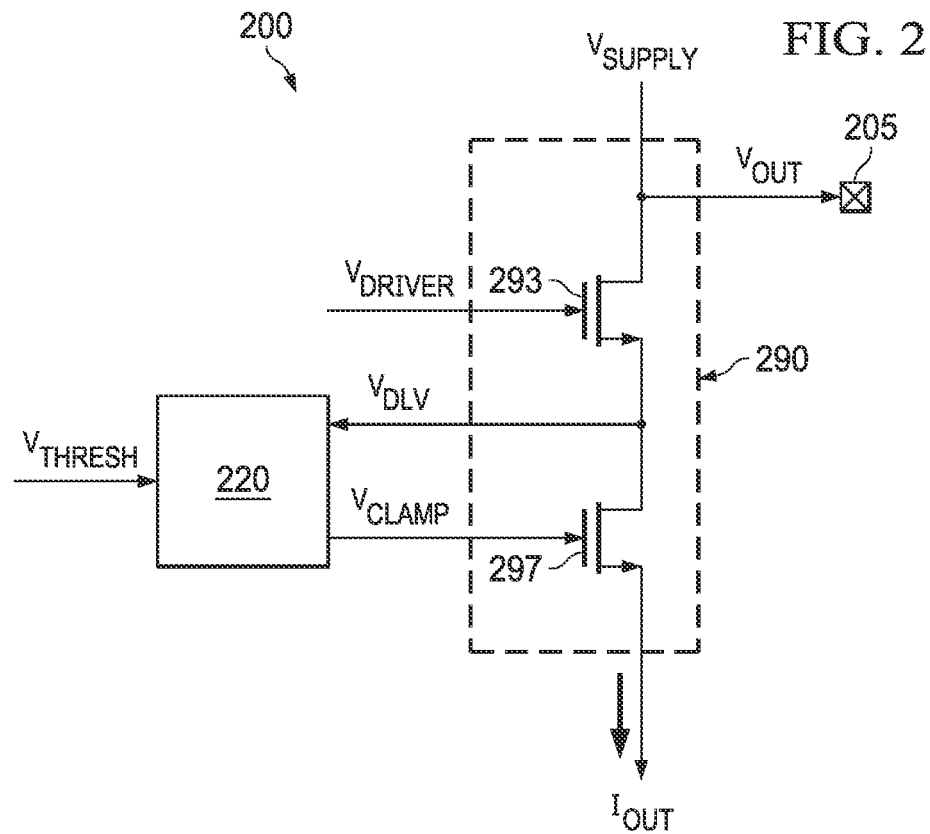
FIG. 2 is a block diagram of an example output stage of a high voltage operational amplifier that includes an example dynamic current limit circuit, according to one aspect of this description.

FIG. 2 is a block diagram of an example output stage of a high voltage operational amplifier 200 that includes a dynamic current limit circuit 220 and an output stage 290. The output stage 290 includes an n-type high voltage depletion-enhancement metal oxide semiconductor FET (DE-MOSFET) 293 having a drain connected to an output pin 205 of the output stage of the high voltage operational amplifier 200 and to supply voltage $V_{SUPPLY}$. The gate of the HV DE-MOSFET 293 receives a driver voltage $V_{DRIVER}$.

An n-type low voltage (LV) MOS device 297 includes a drain that is coupled to a source of the HV DE-MOSFET 293 and includes a source connected to a common node (e.g., a ground or other reference voltage). One function of the HV DE-MOSFET 293 is to protect the LV MOS device 297 from damage when high voltage is driven on the output pin 205 of the output stage of the high voltage operational amplifier 200. The positive driver voltage $V_{DRIVER}$ maintains the HV DE-MOSFET 293 in an ON mode. When a high voltage is present on the output pin 205, the voltage drop across the HV DE-MOSFET 293 will be a significant portion of the output voltage. In this manner, at high output voltages the voltage drop across the HV DE-MOSFET 293 significantly limits the drain voltage of the LV MOS device 297. When a low voltage is present on the output pin 205, the voltage drop across the HV DE-MOSFET 293 is much lower and the drain voltage of the LV MOS device 297 is much closer to the output voltage.

The LV MOS device 297 controls the output current $I_{OUT}$ through the output stage 290. As described above, excessive current through the output stage could cause the HV DE-MOSFET 293 to operate outside the SOA. With fixed current limiting, as shown by the dashed line in FIG. 1, regardless of the output voltage, the output current is limited to the maximum amount of current that can be sunk when the output voltage at its maximum value. Thus, even though the HV DE-MOSFET 293 could conduct a current greater than the short circuit current at lower output voltages and remain within the SOA, the amount of current in a fixed current limiting scheme is capped at the short circuit current for all output voltages. This unnecessarily limits the current capabilities of the output stage 290 at lower output voltages, which may represent a fairly significant portion of the operating conditions of the operational amplifier.

The dynamic current limit circuit 220 controls a clamping voltage $V_{CLAMP}$ provided to the gate of the LV MOS device 297 to cause the LV MOS device 297 to limit the flow of output current $I_{OUT}$ through the output stage 290 as the output voltage $V_{OUT}$ approaches and exceeds the threshold voltage. The dynamic current limit circuit 220 senses the drain voltage $V_{DLV}$ of the LV MOS device 297 to determine a relative level of the output voltage of the operational amplifier. When the output voltage is low (e.g., lower than the driver voltage $V_{DRIVER}$ reduced by the $V_{th}$ of the HV DE-MOSFET 293), the drain voltage of the LV MOS device 297 is determined by the output voltage $V_{OUT}$. When the output voltage is high, the drain voltage of the LV MOS device 297 is determined by the gate voltage of the HV DE-MOSFET 293 minus the gate-to-source voltage ($V_{gs}$) of the HV DE-MOSFET 293.

The dynamic current limit circuit 220 receives (or in some examples generates) a threshold voltage $V_{THRESH}$ that is selected to be lower than the drain voltage $V_{DLV}$ of the LV MOS device 297 when the output stage 290 is supplying a high output voltage. The threshold voltage $V_{THRESH}$ sets the output voltage below which the dynamic current limit circuit 220 will be activated to increase the allowed maximum flow of current through the output stage 290. Referring back to FIG. 1, the solid line corresponds to the maximum output current allowed by the dynamic current limit circuit 220.

With a dynamic current limit at lower output voltages the maximum current is higher than the short circuit current. For example, at approximately 2.0 V the maximum current is approximately 26 mA as compared to the short circuit current of approximately 12.5 mA. At output voltages higher than about 3.0 V the maximum current is limited to the short circuit current.

To summarize, the dynamic current limit circuit 220 operates in one of two operational modes, the operational mode being controlled based on a comparison of $V_{DLV}$ and $V_{THRESH}$. When $V_{DLV}$ is greater than $V_{THRESH}$, the dynamic current limit circuit 220 operates in a first mode and sets $V_{CLAMP}$ to limit current through the LV MOS device 297 to the short circuit current of the operational amplifier. When $V_{DLV}$ is lower than $V_{THRESH}$, the dynamic current limit circuit 220 operates in a second mode and increases $V_{CLAMP}$ to allow more current to flow through the LV MOS device 297.

In some examples the output stage 290 includes a HV DE-MOSFET 293 as a cascade device and a LV MOS device 297 as an output device. However, the dynamic current limit circuit 220 can also be applied to an amplifier that includes a single MOS device in the output stage because the dynamic current limit circuit 220 senses the output voltage of the amplifier at the drain of the LV MOS device 297 to control the clamping voltage (and thus current) for the LV MOS device 297. Thus the HV DE-MOSFET 293 is not necessary for the dynamic current limit control function.

Figure 3:
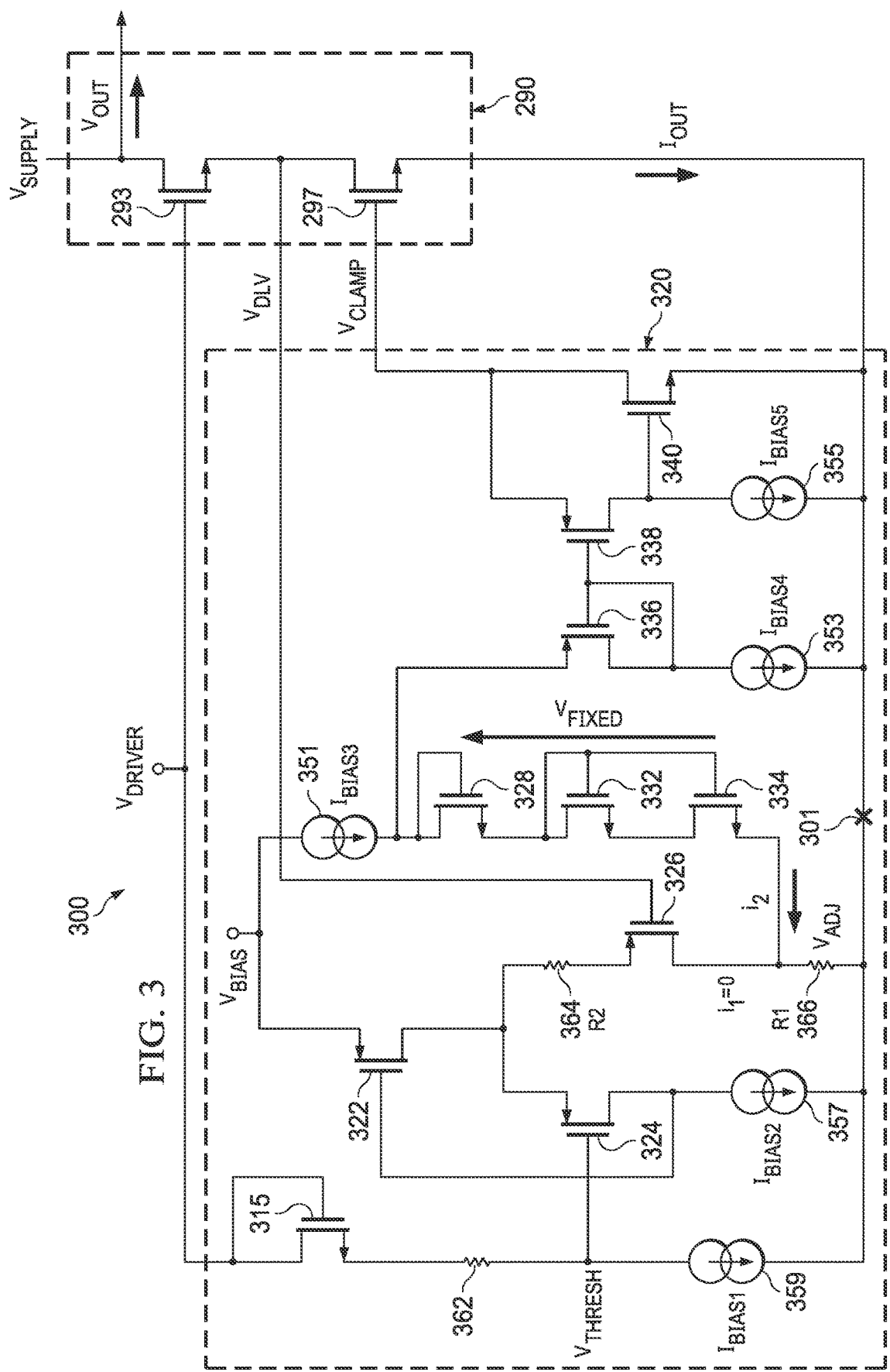
FIG. 3 is a schematic diagram of an output stage of a high voltage operational amplifier that includes an example dynamic current limit circuit operating in a first mode, according to one aspect of this description.

FIG. 3 is a schematic diagram of an output stage of an operational amplifier 300 that includes the output stage 290 and an example dynamic current limit circuit 320. N-type MOS device 315, resistor 362, and constant current source 359 generate a threshold voltage $V_{THRESH}$ from the driver voltage $V_{DRIVER}$. The dynamic current limit circuit 320 receives a bias voltage $V_{BIAS}$ from an external source (e.g., a different functional block implemented on a same integrated circuit as the output stage 290) and includes several constant current sources 351, 353, 355, 357, 359 that provide biasing currents $I_{BIAS3}$, $I_{BIAS4}$, $I_{BIAS5}$, $I_{BIAS2}$, and $I_{BIAS1}$, respectively, to various parts of the dynamic current limit circuit 320. In one example, $I_{BIAS1}$, $I_{BIAS2}$, $I_{BIAS4}$, and $I_{BIAS5}$ are equal and $I_{BIAS3}$ is twice $I_{BIAS1}$.

The bias voltage $V_{BIAS}$ is applied to the source of p-type MOS device 322. The drain voltage of MOS device 322 is applied to the source of p-type MOS device 324. The drain voltage of MOS device 322 reduced by a voltage drop across resistor 364 is applied to the source of p-type MOS device 326. Current source 357 assures a constant current $I_{BIAS2}$ through the drain node of MOS device 324. The gate voltage of MOS device 322 adjusts so that the current flowing through the MOS device 324 remains $I_{BIAS2}$.

MOS devices 324 and 326 act like a differential pair with an offset determined by a resistance R2 of resistor 364. The operational mode of the MOS device 326 is controlled based on a comparison between $V_{DLV}$ and $V_{THRESH}$. When $V_{DLV}$ at the gate of MOS device 326 is higher than $V_{THRESH}$ at the gate of MOS device 324, MOS device 326 is an OFF mode and no current is conducted through MOS device 326 (e.g., $I_1$ is zero as shown in FIG. 3). When $V_{DLV}$ at the gate of MOS device 326 is less than $V_{THRESH}$ at the gate of MOS device 324, MOS device 326 turn to an ON mode and current $I_1$ is conducted through MOS device 326. As this additional current is conducted through MOS device 326, the gate voltage of MOS device 322 is adjusted so that the MOS device 322 conducts $I_{BIAS2}$ plus the current $I_1$ conducted through MOS device 326. As $V_{DLV}$ falls further below $V_{THRESH}$ the MOS device 326 will conduct a higher current as the $V_{gs}$ of the MOS device 326 increases.

An internal low drop out (LDO) bias voltage $V_{BIAS}$ and a biasing current $I_{BIAS3}$ provided by the constant current source 351 generate a constant voltage $V_{FIXED}$ across a set of series connected n-type MOS devices 328, 332, 334. A current $I_2$ flows through the set of series-connected MOS device 328, 332, 334. A voltage clamp circuit includes p-type MOS devices 336 and 338, n-type MOS device 340, and constant current sources 353 and 355. The constant current sources 353, 355 maintain equal currents $I_{BIAS4}$, $I_{BIAS5}$, through the MOS devices 336 and 338, respectively. The source voltage of MOS device 338 will not exceed the source voltage of MOS device 336. In this manner, the voltage clamp circuit limits the voltage $V_{CLAMP}$ to the drain voltage of the MOS device 328 which is present at the source of MOS device 336. The drain voltage of the MOS device 328, and therefore the clamping voltage $V_{CLAMP}$, is limited to the sum of the fixed voltage across the set of series-connected MOS devices 328, 332, 334 and an adjustable voltage $V_{ADJ}$ that is generated across resistor 366.

When the drain voltage $V_{DLV}$ of the LV MOS device 297 is greater than the threshold voltage, the MOS device 326 will have sufficiently low $V_{gs}$ to cause the MOS device 326 to turn to the OFF mode and current will not flow through the MOS device 326 (i.e., $I_1$=0). When the drain voltage $V_{DLV}$ of the LV MOS device 297 is below the threshold voltage, the MOS device 326 will be in the ON mode and current will flow through the MOS device 326 (i.e., $I_1 \neq 0$) to common node 301 (e.g., ground). Thus the adjustable voltage $V_{ADJ}$, which will change depending on whether current is flowing through the MOS device 326, varies as a function of the relationship between the threshold voltage $V_{THRESH}$ and the drain voltage of the LV MOS device 297 $V_{DLV}$.

FIG. 3 illustrates the operation of the dynamic current limit circuit 320 in the first mode because $V_{DLV}$ is greater than the threshold voltage $V_{THRESH}$. When $V_{DLV}$ is greater than the threshold voltage $V_{THRESH}$, the output voltage $V_{OUT}$ of the operational amplifier is high enough that the output current should be limited to the short circuit current. In the first mode, MOS device 326 is in the OFF mode and $I_1$ is zero. The adjustable voltage is equal to the current $I_2$ flowing through the set of series-connected MOS devices 328, 332, 334 multiplied by the resistance R1 of resistor 366. This results in a clamping voltage that will limit the current through the output stage 290. The clamping voltage $V_{CLAMP}$ will remain relatively constant as output voltage falls until a threshold relationship between the threshold voltage and the drain voltage $V_{DLV}$ of the LV MOS device 297 is reached (e.g., $V_{THRESH}=V_{DLV}$).

Figure 4:
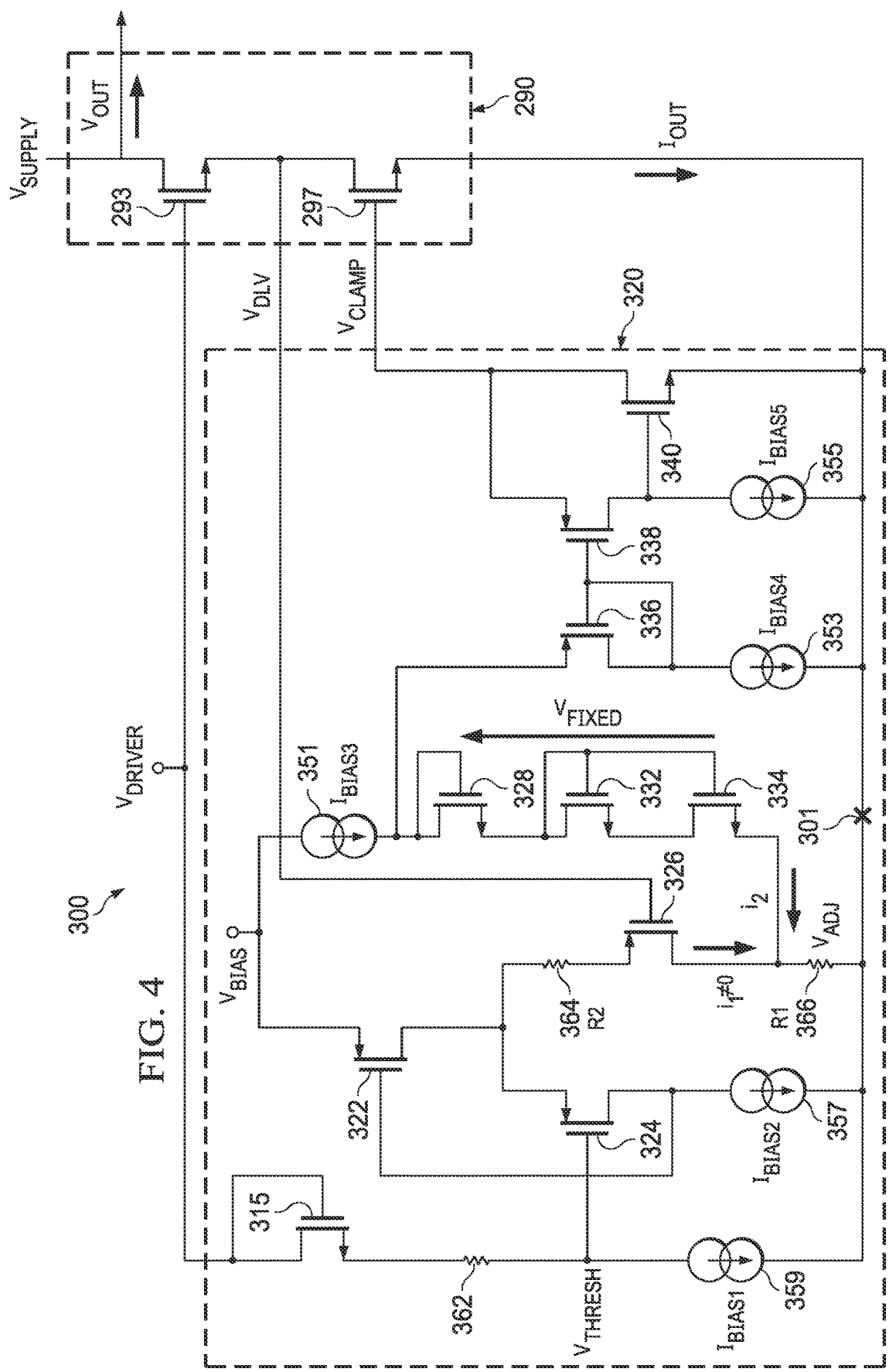
FIG. 4 is a schematic diagram of the example output stage of a high voltage operational amplifier of FIG. 3 operating in a second mode, according to one aspect of this description.

FIG. 4 illustrates the operation of the dynamic current limit circuit 320 in the second mode because $V_{DLV}$ is less than the threshold voltage $V_{THRESH}$. When $V_{DLV}$ is below the threshold voltage $V_{THRESH}$ the output voltage $V_{OUT}$ of the operational amplifier is low enough that the output current need not be limited to the short circuit current. In the second mode MOS device 326 is in the ON mode and $I_1$ is not zero (as depicted in FIG. 4). The current $I_1$ will increase as the output voltage falls. The adjustable voltage $V_{ADJ}$ is equal to the sum of $I_1$ and $I_2$ multiplied by the resistance R1 of resistor 366. This results in a higher clamping voltage $V_{CLAMP}$ (as compared to $V_{CLAMP}$ when $V_{OUT} > V_{THRESH}$) that will allow for increased current through the output stage 290.

When the MOS device 326 is in the ON mode, a positive feedback loop is created in which the clamping voltage $V_{CLAMP}$ increases as the drain voltage of the LV MOS device 297 decreases. The gain of this positive feedback loop may be controlled to be less than 1 as described below.

Figure 5:
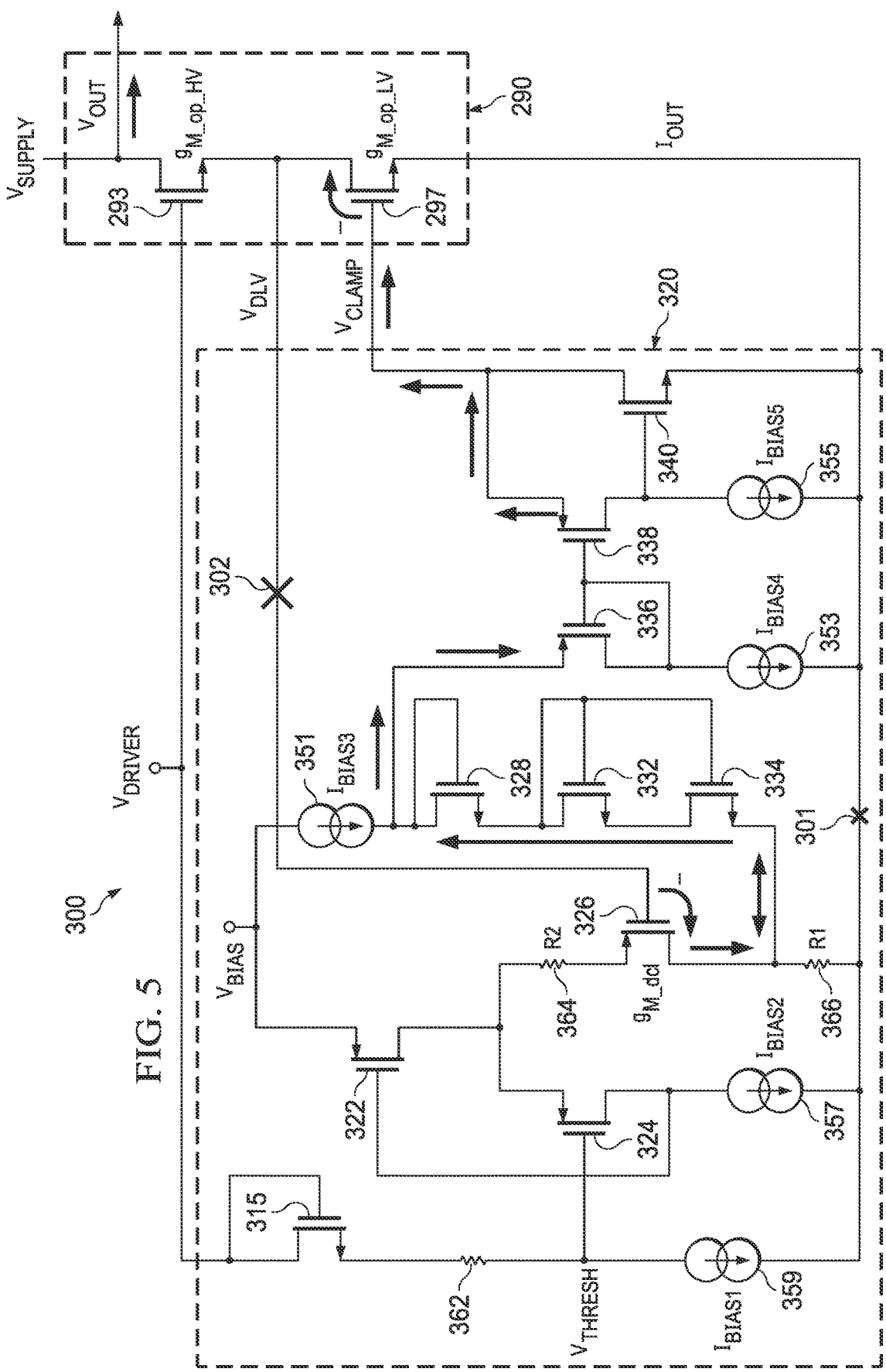
FIG. 5 is a schematic diagram of the example output stage of a high voltage operational amplifier of FIG. 3 with a feedback loop opened to calculate gain, according to one aspect of this description.

FIG. 5 illustrates the dynamic current limit circuit 320 with a hypothetical break 302 (indicated by the X) in the positive feedback loop created when the MOS device 326 is in the ON mode. With the feedback loop thus cut, the gain of the dynamic current limit loop may be expressed as:

$$\text{Voltage Gain} = \left(g_{M_{dcl\_eff}}\right) \times R1 \times \frac{g_{M\_op\_LV}}{g_{M\_op\_HV}} \quad \text{EQ. 1}$$

where $g_{M_{dcl\_eff}}$ is the gain of the dynamic current limit circuit when the MOS device 326 is ON.

$$g_{M_{dcl\_eff}} = \frac{g_{M_{dcl}}}{1 + g_{M_{dcl}} \cdot R2} \approx \frac{1}{R2} \quad \text{EQ. 2}$$

Thus, the voltage gain can be simply approximated as:

$$\text{Voltage Gain} \approx \frac{R1}{R2} \times \frac{g_{M\_op\_LV}}{g_{M\_op\_HV}} \quad \text{EQ. 3}$$

The values of R1 and R2 are chosen such that the voltage gain is less than 1 to make the positive feedback loop stable.

FIG. 6 is a current vs. voltage plot depicting the effects of the positive feedback loop on several design considerations for the output stage of the operational amplifier of FIGS. 3-5. Cases 1 and 2 illustrate the maximum current that will be allowed when the gain of the feedback loop is greater than 1 while Case 3 illustrates maximum current when the gain is less than one. In both Cases 1 and 2 the maximum current is greater than in Case 3 due to the larger feedback gain in Cases 1 and 2. Case 1 illustrates the scenario in which the HV DE-MOSFET 293 is not sized to support increased current. In this instance the LV MOS device 297 will operate in the triode mode and remain in the triode mode even when the operational amplifier goes into short circuit mode and the HV DE-MOSFET 293 may operate outside the SOA. Case 2 illustrates the scenario in which the size of the HV DE-MOSFET 293 has sufficient size to support the increased current. While the current is limited so that the HV DE-MOSFET 293 does not operate outside the SOA, increasing the size of the HV DE-MOSFET 293 in this manner leads to undesirable increases in cost and package size. As illustrated in Case 3, when the gain of the feedback loop is less than one, HV DE-MOSFET 293 operates within the SOA while allowing for increased current at lower voltages.

In the illustrated examples, all of the devices besides the HV DE-MOSFET 293 are low voltage MOS devices. This is advantageous in terms of size and cost.

As described above, dynamic current limit enables an operational amplifier to sink or source higher than a short circuit current when an output voltage of the operational amplifier is relatively low while sufficiently limiting the current sunk or sourced to protect a DE-MOSFET in the operational amplifier's output stage when the operational amplifier is near a short circuit condition.

The methods are illustrated and described above as a series of acts or events, but the illustrated ordering of such acts or events is not limiting. For example, some acts or events may occur in different orders and/or concurrently with other acts or events apart from those illustrated and/or described herein. Also, some illustrated acts or events are optional to implement one or more aspects or embodiments of this description. Further, one or more of the acts or events depicted herein may be performed in one or more separate acts and/or phases. In some embodiments, the methods described above may be implemented in a computer readable medium using instructions stored in a memory.

In this description, the term "couple" may cover connections, communications or signal paths that enable a functional relationship consistent with this description. Accordingly, if device A generates a signal to control device B to perform an action, then: (a) in a first example, device A is coupled directly to device B; or (b) in a second example, device A is coupled to device B through intervening component C if intervening component C does not substantially alter the functional relationship between device A and device B, so device B is controlled by device A via the control signal generated by device A.

Modifications are possible in the described examples, and other implementations are possible, within the scope of the claims.

What is claimed is:

1. An output stage, comprising:
    a first metal oxide semiconductor (MOS) device having a first gate, a first drain, and a first source; and
    a current limit circuit comprising
        a second MOS device having a second gate, a second drain, and a second source, the second gate being coupled to a drain of the first MOS device;
        a resistor coupled between the second drain and a ground;
        a third MOS device having a third gate, a third drain, and a third source, the third gate being coupled to a first voltage source, the third source being coupled to the second source, and the third drain being coupled to a first current source,
        the second MOS device operating in an OFF mode responsive to a drain voltage of the first MOS device being greater than the first voltage source, and the second MOS device operating in an ON mode responsive to the drain voltage of the first MOS device being less than the first voltage source;
        a plurality of series-connected MOS devices, wherein a first voltage is generated across the plurality of series-connected MOS devices in response to a biasing current supplied to a drain of one of the plurality of series-connected MOS devices, wherein a source of another of the plurality of series-connected MOS devices is coupled to the resistor; and
        a voltage clamp circuit coupled between the drain of the one of the plurality of series-connected MOS devices and the first gate.

2. The output stage of claim 1, wherein the resistor is a first resistor and wherein the output stage further comprises a second resistor coupled between the second source and the third source, wherein a first resistance of the first resistor and a second resistance of the second resistor are selected such that a gain of a feedback loop of the current limit circuit when the second MOS device is activated is less than 1.

3. The output stage of claim 1, further comprising a high voltage MOS device having a source coupled to the first drain, a gate coupled to a first terminal and a drain coupled to a second terminal.

4. The output stage of claim 1, wherein the first MOS device, the second MOS device, the third MOS device, and the plurality of series-connected MOS devices are low voltage MOS devices.

5. The output stage of claim 3, wherein a current flowing through the high voltage MOS device when a voltage on the second terminal is higher than a threshold voltage is lower than the current flowing through the high voltage MOS device when the voltage on the second terminal is lower than the threshold voltage.

6. The output stage of claim 1, wherein the voltage clamp circuit comprises:
a fourth MOS device having a fourth gate, a fourth drain, and a fourth source, wherein the fourth source is coupled to the drain of the one of the plurality of series-connected MOS devices;
a second current source coupled between the fourth drain and ground;
a fifth MOS device having a fifth gate, a fifth drain, and a fifth source, wherein the fifth gate is coupled to the fourth gate and the fifth source is coupled to the first gate; and
a sixth MOS device having a sixth gate, a sixth drain, and a sixth source, wherein the sixth drain is coupled to the fifth source, the sixth gate is coupled to the fifth drain, and the sixth source is coupled to ground.

7. An output stage, comprising:
a low voltage (LV) metal oxide semiconductor (MOS) device; and
a current limit circuit configured to
sense a drain voltage of the LV MOS device; and
increase a clamping voltage for the LV MOS device when the drain voltage of the LV MOS device is less than a threshold voltage;
wherein LV MOS device is a first LV MOS device having a first gate, a first drain, and a second source, and wherein the current limit circuit comprises:
a second MOS device having a second gate, a second drain, and a second source, the second gate being coupled to a drain of the first LV MOS device;
a resistor coupled between the second drain and a ground;
a third MOS device having a third gate, a third drain, and a third source, the third gate being coupled to a threshold voltage source, the third source being coupled to the second source, and the third drain being coupled to a first current source,
the second MOS device configured to operate in an OFF mode when the drain voltage of the first MOS device is greater than the threshold voltage, and the second MOS device configured to operate in an ON mode when the drain voltage of the first MOS device is less than the threshold voltage;
a plurality of series-connected MOS devices, wherein a first voltage is generated across the plurality of series-connected MOS devices in response to a biasing current supplied to a drain of one of the plurality of series-connected MOS devices, wherein a source of another of the plurality of series-connected MOS devices is coupled to the resistor so that a combination of a first current flowing through the second MOS device and a second current flowing through the plurality of series-connected MOS devices generates a second voltage across the resistor, wherein a drain voltage of the one of the plurality of series-connected MOS devices is a sum of the first voltage and the second voltage; and
a voltage clamp circuit coupled between the drain of the one of the plurality of series-connected MOS devices and the first gate, wherein a gate-to-source voltage of the first MOS device is limited to the drain voltage of the one of the plurality of series-connected MOS devices.

8. The output stage of claim 7, wherein the resistor is a first resistor and wherein the current limit circuit further comprises a second resistor coupled between the second source and the third source, wherein a first resistance of the first resistor and a second resistance of the second resistor are selected such that a gain of a feedback loop of the operational amplifier when the second MOS device is activated is less than 1.

9. The output stage of claim 7, wherein the second MOS device, the third MOS device, and the plurality of series-connected MOS devices are low voltage MOS devices.

10. The output stage of claim 7, wherein the voltage clamp circuit comprises:
a fourth MOS device having a fourth gate, a fourth drain, and a fourth source, wherein the fourth source is coupled to the drain of the one of the plurality of series-connected MOS devices;
a second current source coupled between the fourth drain and the ground;
a fifth MOS device having a fifth gate, a fifth drain, and a fifth source, wherein the fifth gate is coupled to the fourth gate and the fifth source is coupled to the first gate; and
a sixth MOS device having a sixth gate, a sixth drain, and a sixth source, wherein the sixth drain is coupled to the fifth source, the sixth gate is coupled to the fifth drain, and the sixth source is coupled to ground.

11. A current limit circuit, comprising:
a first metal oxide semiconductor (MOS) device having a first gate, a first drain, and a first source,
a resistor coupled between the first drain and ground;
a second MOS device having a second gate, a second drain, and a second source, the second gate being coupled to a threshold voltage, the second source being coupled to the first source, and the second drain being coupled to a first current source,
the first MOS device configured to operate in an OFF mode when a drain voltage of the low voltage MOS device is greater than the threshold voltage, and the first MOS device configured to operate in an ON mode when the drain voltage of the low voltage MOS device is less than the threshold voltage;
a plurality of series-connected MOS devices, wherein a first voltage is generated across the plurality of series-connected MOS devices in response to a biasing current supplied to a drain of one of the plurality of series-connected MOS devices, wherein a source of a another of the plurality of series-connected MOS devices is coupled to the resistor; and
a voltage clamp circuit coupled between the drain of the one of the plurality of series-connected MOS devices and a gate of the low voltage MOS device in the output stage of the operational amplifier.

12. The current limit circuit of claim 11, wherein the resistor is a first resistor and wherein the current limit circuit further comprises a second resistor coupled between the first source and the second source, wherein a first resistance of the first resistor and a second resistance of the second resistor are selected such that a gain of a feedback loop of the dynamic current limit circuit when the first MOS device is activated is less than 1.

13. The current limit circuit of claim 12, wherein the first MOS device, the second MOS device, and the plurality of series-connected MOS devices are low voltage MOS devices.

14. The current limit circuit of claim 12, wherein the voltage clamp circuit comprises:
- a fourth MOS device having a fourth gate, a fourth drain, and a fourth source, wherein the fourth source is coupled to the drain of the one of the plurality of series-connected MOS devices;
- a second current source coupled between the fourth drain and ground;
- a fifth MOS device having a fifth gate, a fifth drain, and a fifth source, wherein the fifth gate is coupled to the fourth gate and the fifth source is coupled to the first gate; and
- a sixth MOS device having a sixth gate, a sixth drain, and a sixth source, wherein the sixth drain is coupled to the fifth source, the sixth gate is coupled to the fifth drain, and the sixth source is coupled to ground.

* * * * *